(12) United States Patent
Gregorius (10) Patent No.: US 7,215,597 B2
(45) Date of Patent: May 8, 2007

(54) MEMORY DEVICE HAVING COMPONENTS FOR TRANSMITTING AND RECEIVING SIGNALS SYNCHRONOUSLY

(75) Inventor: Peter Gregorius, München (DE)

(73) Assignee: Infineon Technologies AG, Munich (DE)

( * ) Notice: Subject to any disclaimer, the term of this patent is extended or adjusted under 35 U.S.C. 154(b) by 90 days.

(21) Appl. No.: 11/046,160

(22) Filed: Jan. 28, 2005

(65) Prior Publication Data
US 2006/0181956 A1 Aug. 17, 2006

(51) Int. Cl.
*G11C 8/00* (2006.01)
(52) U.S. Cl. ............ 365/233; 365/189.05; 365/189.01; 365/194
(58) Field of Classification Search ................ 365/233, 365/189.05, 189.01, 194
See application file for complete search history.

(56) References Cited

U.S. PATENT DOCUMENTS 6,636,445 B2 * 10/2003 Ohshima et al. ............ 365/190
2002/0041536 A1 * 4/2002 Tomita ........................ 365/233

* cited by examiner

*Primary Examiner*—Huan Hoang
(74) *Attorney, Agent, or Firm*—Patterson & Sheridan, L.L.P.

(57) ABSTRACT

One embodiment of the present invention provides a memory device comprising an array of memory cells, a control logic for writing data to and reading data from the array of memory cells, the control logic comprising a first interface, an input/output section for exchanging data, address and control signals with a circuit external to the memory device, the input/output section comprising a second interface for sending signals to and receiving signals from the first interface of the control logic, and a synchronizing facility connected to the first interface of the control logic and to the second interface of the input/output section for synchronizing the first interface of the control logic and the second interface of the input/output section.

20 Claims, 6 Drawing Sheets

MEMORY DEVICE HAVING COMPONENTS FOR TRANSMITTING AND RECEIVING SIGNALS SYNCHRONOUSLY

BACKGROUND OF THE INVENTION

1. Field of the Invention

The present invention refers to a memory device and to memory device parts for transmitting and receiving signals in a synchronous way.

2. Description of the Related Art

A conventional memory device comprises an array of memory cells, a control logic for addressing single memory cells or groups of memory cells and for writing data to and reading data from the array of memory cells and an input/output section. The memory device exchanges data, address and control signals via the input/output section with circuits external to the memory device, for example, with a memory controller. The array of memory cells, a control logic and the input/output section include interfaces for communication between them. Signal exchange between the interfaces of the array of memory cells, the control logic and the input/output section is asynchronous.

The input/output section comprises receiver circuits and on-chip drivers (OCD) serving as interface for communication with the circuits external to the memory device. The input/output section is subdivided into a first part for receiving control signals from the external circuits and a second part for receiving address and data signal from and transmitting data signals to the external circuits.

In future computers, the rate of data exchange between the processor, the memory controller and the memory devices will further grow. Therefore, the memory devices will transmit and receive data, address and control signals via high speed interfaces with very high bit rates on each single line.

On the other hand, due to the constraints of the semiconductor technology used for the production of memory devices, the bit rates on internal lines of memory devices will be much lower and rise much slower than the external bit rates. Therefore, the input/output section will convert external bit rates to internal bit rates and internal bit rates to external bit rates by a high and still rising factor. To keep the total amount of data constant, the number of parallel internal lines and the number of parallel external lines differs by the same factor. If, for example, the external bit rate is four times as high as the internal bit rate, the number of parallel internal lines will be four times as many as the number of external lines.

The conversion of lowly parallel (i.e., relatively few parallel lines; e.g., eight or less parallel lines) high bit rate external data transfer to highly parallel (i.e., relatively high number of parallel lines; e.g., sixty four or more parallel lines) low bit rate internal data transfer and vice versa in the inpuVoutput section is highly error-prone. The risk of an error increases with the factor of conversion.

SUMMARY OF THE INVENTION

One aspect of the present invention provides an improved memory device and more particularly, a memory device operable at high external and low internal bit rates with no or a low risk of errors.

One embodiment of the present invention is a memory device comprising an array of memory cells, a control logic for writing data to and reading data from the array of memory cells, the control logic comprising a first interface, an input/output section for exchanging data, address and control signals with a circuit external to the memory device, the input/output section comprising a second interface for sending signals to and receiving signals from the first interface of the control logic, and a synchronizing facility connected to the first interface of the control logic and to the second interface of the input/output section for synchronizing the first interface of the control logic and the second interface of the input/output section.

Another embodiment of the present invention is a memory device comprising an array of memory cells, a control logic for writing data to and reading data from the array of memory cells, the control logic comprising a first interface, an input/output section for exchanging data, address and control signals with a circuit external to the memory device via a first number of parallel first lines at a first bit rate at each line, the input/output section comprising a second interface for sending signals to and receiving signals from the first interface of the control logic via a second number of parallel second lines at a second bit rate at each second line, the second number being greater than the first number, and the second bit rate being less than the first bit rate, and a synchronizing facility for synchronizing the first interface of the control logic and the second interface of the input/output section.

Yet another embodiment of the present invention is a memory device comprising an array of memory cells, a control logic for writing data to and reading data from the array of memory cells, an input/output section for receiving and transmitting data, address and control signals, and a clock line connected to the control logic and to the input/output section for transmitting a clock signal between the control logic and the input/output section.

Yet another embodiment of the present invention is a memory device comprising an array of memory cells, a control logic for writing data to and reading data from the array of memory cells, an input/output section for receiving and transmitting data, address and control signals, and a synchronizing facility for synchronizing the clock of the control logic, the clock of the input/output section and the clock provided for writing data to or reading data from the array of memory cells.

Yet another embodiment of the present invention is a memory device comprising an array of memory cells, a control logic for writing data to and reading data from the array of memory cells, an input/output section for receiving and transmitting data, address and control signals, a clock receiver for receiving a clock signal from an external memory controller, and a synchronizing facility connected to the clock receiver, to the input/output section and to the control logic for synchronizing the control logic and the input/output section to the external memory controller.

Embodiments of the present invention are based on the idea of providing a synchronous exchange of signals between the components or sections of a memory device. For this purpose, a synchronizing facility is provided for synchronizing a first interface of a control logic of the memory device and a second interface of the input/output of the memory device. The synchronizing facility is connected to the interface of the control logic and to the second interface of the input/output section. According to one embodiment, the synchronizing facility is a clock line connected to first and second interfaces or directly to the control logic and the input/output section. The synchronizing facility synchronizes the clock of the control logic, the clock of the input/output section and the clock provided for writing data to or reading data from the array of memory cells.

According to another embodiment, the synchronizing facility synchronizes the control logic and the input/output to an external memory controller.

Embodiments of the present invention provide the advantage that the exchange of signals between the interfaces of the components or sections of the memory device is improved and made more secure. Particularly advantages are achieved because the input/output section of the memory device converts an external lowly parallel high bit rate data transfer to an internal highly parallel low bit rate data transfer and vice versa. This conversion is particularly stable and reliable when components or sections of the memory device or their interfaces are synchronised by a clock signal which is derived from an external clock signal by clock division. In this case, the external clock is divided by the same factor as the bit rate is reduced from external to internal and the number of parallel lines is increased correspondingly from external to internal.

BRIEF DESCRIPTION OF THE DRAWINGS

These and other aspects and features of the present invention will become clear from the following description taken in conjunction with the accompanying drawings in which.

DETAILED DESCRIPTION OF THE PREFERRED EMBODIMENT

Figure 1:
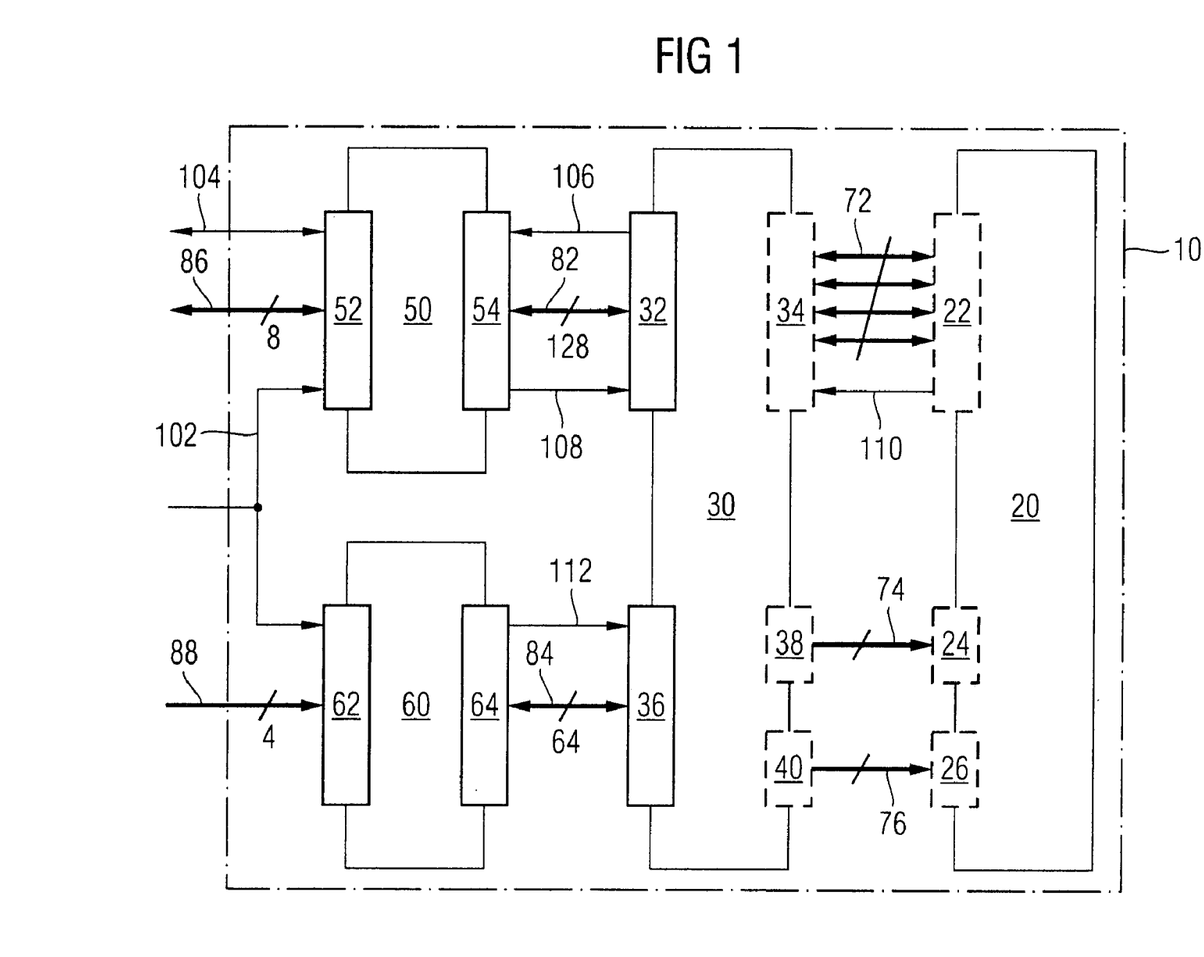
FIG. 1 is a schematic circuit diagram of a memory device according to a first embodiment of the present invention.

FIG. 1 is a schematic circuit diagram of a memory device 10 according to a first embodiment of the present invention. The memory device 10 comprises an array 20 of memory cells. The memory cells may be dynamic memory cells, and each cell may include a storage capacitor and an access transistor connecting the storage capacitor to a bit line, the access transistor being controlled via a word line. Alternatively, the memory cells of the array 20 may be any other kind of dynamic or static memory cells.

The array 20 of memory cells is provided with a first interface 22 for receiving data, or data signals, to be stored in the memory cells of the array 20 and for transmitting data, or data signals, read from memory cells of the array 20. Further, the array 20 is provided with second and third interfaces 24, 26 for receiving addresses, or address signals, of memory cells in which data are to be stored or from which data are to be read. In one embodiment, the second interface 24 receives a column address identifying a bit line, and the third interface 26 receives a row address identifying a word line.

Further, the memory device 10 comprises a control logic 30, which is also called a memory spine control logic. The control logic 30 is provided with a fourth interface 32, a fifth interface 34 (which is connected to the first interface 22 of the array 20 of memory cells), a sixth interface 36, a seventh interface 38 (connected to the second interface 24 of the array 20 of memory cells), and an eighth interface 40 (connected to the third interface 26 of the array 20 of memory cells). Further, the memory device 10 comprises an input/output section comprising a first input/output section part 50 and a second input/output section part 60. The first part 50 is provided with a ninth interface 52 and a tenth interface 54 (connected to the fourth interface 32 of the control logic 30). The second part 60 of the input/output section is provided with an eleventh interface 62 and a twelfth interface 64 (connected to the sixth interface 36 of the control logic 30).

The interfaces 22, 24, 26, 32, 34, 36, 38, 40, 54, 64, which are connected to other interfaces within the memory device, are connected, or coupled, via one or more respective pluralities of parallel single lines (or one or more respective buses) 72, 74, 76, 82, 84. The ninth interface 52 of the first part 50 of the input/output section and the eleventh interface 62 of the second part 60 of the input/output section are connected to a memory controller or to any other circuit external to the memory device 10 via a respective plurality of single lines (or buses) 86, 88.

As an example, according to FIG. 1, the ninth interface 52 is connected to the memory controller or any other external circuit via eight lines (or an eight-line bus) 86; the eleventh interface 62 of the second part 60 of the input/output section is connected to the memory controller or other external circuits via four lines (or a four-line bus) 88; the tenth interface 54 of the first part 50 of the input/output section is connected to the fourth interface 32 of the control logic 30 via 128 lines (or a 128-line bus) 82; and the twelfth interface 64 of the second part 60 of the input/output section is connected to the sixth interface 36 of the control logic 30 via 64 lines (or a 64-line bus) 84. The number of lines 72 connecting the fifth interface 34 of the control logic 30 and the first interface 22 of the array 20 of memory cells, the number of lines 74 connecting the seventh interface 38 of the control logic 30 and the second interface 24 of the array 20 of memory cells and the number of lines 76 connecting the eighth interface 40 of the control logic 30 and the third interface 26 of the array 20 of the memory cells depend on the architecture or organization of the array 20 of memory cells.

If the address decoders are integrated into the control logic 30, the numbers of lines 74, 76 connecting the seventh and eighth interfaces 38, 40 of the control logic and the second and third interfaces 24, 26 of the array 20 of memory cells are the numbers of bit lines and word lines, respectively, in the array 20 of memory cells. When the array 20 comprises several sub-arrays organized in banks or the like, the bank address may be transmitted via additional lines.

The lines (or buses) 72, 74, 76, 82, 84, 86, 88 are represented by single or double headed arrows indicating that the lines transmit a signal in one or two directions. In particular, in this embodiment, control and address signals are transmitted in one direction only from the memory controller or external circuit to the second part 60 of the input/output section via the lines 88 and the twelfth interface 64. In the second part 60 of the input/output section and its eleventh interface 62, the control and address signals are latched, amplified and converted from a high bit rate on four parallel lines 88 to a low bit rate on 64 parallel lines 84. Throughout this document, the bit rate is defined as the bit rate on one single line. Since the number of parallel lines increased from four to 64 (i.e., by a factor of 16), the bit rate is reduced by a corresponding factor of 16. If, for example, the external bit rate on each of the lines 88 is 3.2 Gbit/s, the internal bit rate on each of the lines 84 is 200 Mbit/s.

The converted control and address signals may be latched or buffered in a FIFO memory (FIFO=first in first out) and amplified by amplifiers or drivers, the FIFO memory and the amplifiers being part of the second part 60 of the input/output section and/or its twelfth interface 64.

The converted address and control signals are transmitted via the 64 lines 84 and the sixth interface 36 to the control logic 30. The address and control signals may be amplified and/or latched or buffered in the control logic 30 and its sixth interface 36. The control logic 30 may include an address decoder for decoding the address and activating corresponding bit and word lines of the array 30 of memory cells. The activating signals are transmitted via the seventh interface 38 of the control logic 30, the lines 74 and the second interface 24, and via the eighth interface 40 of the control logic 30, the lines 76 and the third interface 26 of the array 20, respectively.

As already mentioned, with the address decoder integrated in the control logic 30, one dedicated line 74, 76 is respectively provided for each bit line and for each word line of the array 20 of memory cells. As an advantageous alternative, the bit lines (or word lines) of the array 20 of memory cells are addressed in groups and each of the lines 74 (or the lines 76) is assigned to and connected to one of these groups.

Data which are to be written into memory cells are received by the memory device 10 via the eight lines 86 and the ninth interface 52 of the first part 50 of the input/output section. The data signals are amplified and latched or buffered in the first part 50 of the input/output section and/or its ninth interface 52. Further, the data signals are converted from the high bit rate on each of the eight parallel lines 86 to a low bit rate on each of 128 parallel lines 82. In the above mentioned numerical example, the bit rate of the data signals is reduced from 3.2 Gbit/s external on each of the eight lines 86 to 200 Mbit/s internal on each of the 128 lines 82. The converted data signals may be buffered in a FIFO memory and amplified in the first part 50 of the input/output section and its tenth interface 54 before they are transmitted to the fourth interface 32 of the control logic 30 via the lines 82.

The control logic 30 controls the writing of the data the memory device 10 received via the lines 86 into memory cells of the array 20. The memory cells into which the data are to be written are identified by an address or addresses received via the lines 88. Each address may identify one or a pre-defined number of memory cells of the array 20. This pre-defined number may equal the number of lines 72 connecting the fifth interface 34 of the control logic 30 and the first interface 22 of the array 20. This pre-defined number of memory cells identified by one address may be smaller or larger than the number of lines 82 (e.g., 128 lines) connecting the tenth interface 54 of the first part 50 of the input/output section and the fourth interface 32 of the control logic 30. Accordingly, data received simultaneously via the 128 lines 82 are written in subsequent steps into different groups of memory cells identified by one or several addresses, or data received by the control logic via the 128 lines 82 over a longer period of time (i.e., several sets of 128 data bits) are written simultaneously into one group of memory cells identified by one address.

Reading data from memory cells of the array 20 is controlled by the control logic 30 in a similar or analogous way. The memory cell or the memory cells the data are to be read from are identified by an address communicated to the memory device 10 via the lines 88. The data are then transmitted to the first part 50 of the input/output section via the fourth interface 32 of the control logic 30, the lines 82 and the tenth interface 54 of the first part 50 of the input/output section. Similar to the writing procedure described above, data read simultaneously from one group of memory cells may be transmitted to the first part 50 of the input/output section simultaneously or over a longer period of time in sets of 128 bits each, or data read subsequently from several sets of memory cells may be transmitted simultaneously.

In the first part 50 of the input/output section or its tenth interface 54, the data may be latched or buffered in a FIFO memory. Further, the data signals are converted from the internal 128-bit parallel low bit rate format received via the 128 parallel lines 82 to an eight-bit parallel high bit rate format transmitted to the memory controller or other external circuit via the eight parallel lines 86. Before the converted data signals are transmitted, they may be amplified in the first part 50 of the input/output section or in its ninth interface 52.

The procedure of writing data to memory cells and the procedure of reading data from memory cells differ in the direction of the conversion of the data signals, or the format of the data signals, in the timing of the address and data signals and in the control signals.

The memory device described above with respect to FIG. 1 differs from a conventional memory device in that a plurality of clock lines 102, 104, 106, 108, 110, 112 are provided. The ninth interface 52 of the first part 50 of the input/output section and the eleventh interface 62 of the second part 60 of the input/output section are connected to the memory controller or other external circuits by a first clock line 102 to receive the clock or clock signal of the external circuit. The ninth interface 52 of the first part 50 of the input/output section is connected to the external circuit by a second clock line 104 to provide the external circuit with the clock from the first part 50 of the input/output section. Third and fourth clock lines 106, 108 connect the fourth interface 32 of the control logic 30 and the tenth interface 54 of the first part 50 of the input/output section. The tenth interface 54 is provided with the clock of the control logic 30 via the third clock line 106. The first part 50 of the input/output section provides its clock to the control logic 30 via the fourth clock line 108. The fifth clock line 110 connects the first interface 22 of the array 20 and the fifth interface 34 of the control logic 30 to provide the clock of the array 20 to the control logic 30. A sixth clock line 112 connects the sixth interface 36 of the control logic 30 and the twelfth interface 64 of the second part 60 of the input/output section to provide the latter's clock to the control logic 30.

The transmission of clock signals via the clock lines 102, 104, 106, 108, 110, 112 parallel to the data, control and address signals via the lines 72, 82, 84, 86, 88 improves the transfer of the signals and particularly the security and reliability of the transfer of the signals. Thereby, the increased bit rates on the lines 72, 82, 84, 86, 88 are facilitated.

The illustration in FIG. 1 may be interpreted in two ways. According to a first interpretation, the clock signals locally generated by each interface 22, 32, 52, 54, 64 or provided by the external circuit are transferred to another interface 32, 34, 36, 52, 54, 62 or to the external circuit, correspondingly, via one of the clock lines 102, 104, 106, 108, 110, 112, and the clock signals are received and utilized only locally in the receiving interface. This means that the clock signals exchanged between the interfaces are exclusively used for synchronizing and improving the data transfer between two interfaces, which provides the above-described advantages.

A second interpretation is that the clock signal transmitted by one interface of a component or section of the memory device 10 is synchronous to the clock signal received by the same or another interface of the same component or section of the memory device 10. This means that the interfaces and the components and sections of the memory device 10 are provided with the same clock and operate simultaneously. Depending on the type of memory cells, on the type of sense amplifier, on other elements of the array 20 and on the mechanism of refreshment of the memory cells, this simultaneity may be restricted with regard to the array 20 of memory cells due to its physical nature.

As already mentioned above, the external bit rates on the lines 86, 88 and the internal bit rates on the lines 82, 84 differ by a factor of 16, for example. Correspondingly, the clock received via the first clock line 102 is divided by a factor of 16 within the input/output section 50, 60. This divided clock is transferred between and used by the interface 22 of the array 20, the interfaces 32, 34, 36 of the control logic 30 and the interfaces 54, 64 of the input/output section 50, 60. In this manner, all the components and sections of the memory device 10 and all their interfaces are operated simultaneously and controlled by the external clock received from the external circuit and by a global internal clock derived from the external clock by division. This global synchrony according to the second interpretation of FIG. 1 provides the further important advantage that the security and reliability of the operation of each single component and section of the memory device 10 is improved. In particular, the conversion of the control, address and data signals from sparsely parallel high bit rate to highly parallel low bit rate and vice versa in the input/output section is improved. Even more, the high conversion factor (e.g., conversion factor of 16) is enabled only due to this global synchrony.

On the other hand, the increasing discrepancy between rapidly increasing amounts of data to be exchanged between the memory controller and the memory device and the technologically founded limitation of the speed of the memory device causes a demand for a high and further growing conversion factor. In this way, the present invention is particularly important for the application of memory devices in future computer systems with vastly increasing amounts of data exchanged between the memory controller and the memory device.

Figure 2:
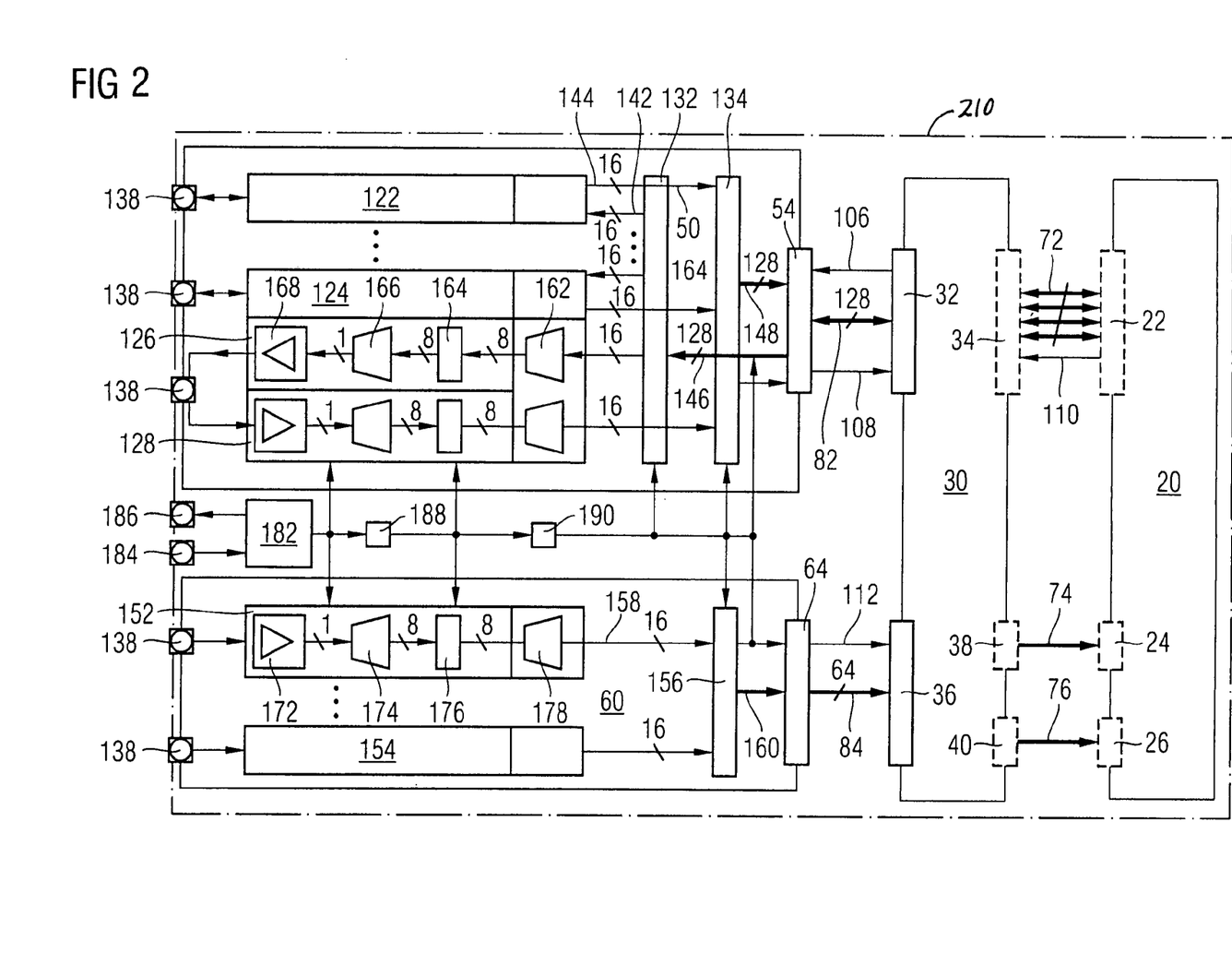
FIG. 2 is a schematic circuit diagram of a memory device according to a second embodiment of the present invention.

FIG. 2 is a schematic circuit diagram of a memory device 210 according to a second embodiment of the present invention. This memory device 210 is similar to the memory device 10 described above with reference to FIG. 1. In contrast to FIG. 1, the internal configuration of the input/output section 50, 60 is displayed.

The first part 50 of the input/output section comprises eight lanes with identical inner structure. Two of the lanes, the first lane 122 and the seventh lane 124, are displayed merely as rectangles. As shown in detail with regard to the eighth lane, it is displayed that each lane consists of a transmitting circuit 126 and a receiving circuit 128.

Furthermore, the first part 50 of the input/output section comprises a first FIFO memory 132 and a second FIFO memory 134. The first part 50 of the input/output section further comprises eight contact pads 138. Each of the contact pads 138 is connected to one of the lanes 122, 124. From the eighth lane, it is shown that in each lane the transmitting circuit 126 and the receiving circuit 128 are connected to the corresponding contact pad 138 in parallel.

All the lanes are further connected to both the first and second FIFO memories 132, 134. As shown in the detailed display of the eighth lane, the transmitting circuit 126 of each lane is connected to the first FIFO memory 132 via sixteen lines 142 and that the receiving circuit 128 of each lane is connected to the second FIFO memory 134 via sixteen lines 144. The first FIFO memory 132 is connected to the tenth interface 54 of the first part 50 of the input/output section via 128 lines 146, and the second FIFO memory 134 is connected to the tenth interface 52 via 128 lines 148.

The second part 60 of the input/output section comprises four lanes, two of which are displayed in FIG. 2 with the reference numerals 152, 154. The second part 60 of the input/output section comprises four contact pads 138, each of which is connected to one of the lanes 152, 154, and a third FIFO memory 156. Each lane is connected to the third FIFO memory 156 via sixteen lines 158. The third FIFO memory 156 is connected to the twelfth interface 64 via 64 lines 160. In contrast to the lanes of the first part 50 of the input/output section, each lane of the second part 60 includes a receiving circuit but does not comprise a transmitting circuit. The receiving circuits of the lanes 152, 154 of the second part 60 and the receiving circuits 128 of the lanes of the first part 50 may comprise the same or similar internal structure.

As shown in the eighth lane of the first part 50 of the input/output section, each transmitting circuit 126 comprises a first multiplexer 162, a register 164, a second multiplexer 166 and an amplifier 168 connected in series between the first FIFO memory 132 and the corresponding contact pad 138. The first multiplexer 162 reduces the number of parallel lines from sixteen to eight and doubles the bit rate on each of the lines. The second multiplexer 166 reduces the number of parallel lines from eight to one and increases the bit rate by a factor of eight. The amplifier 168 is sometimes called an on-chip driver (OCD).

As shown in the representation of the receiving circuit 128 of the eighth lane of the first part and from the representation of the first lane of the second part 60 of the input/output section in FIG. 2, the receiving circuit of each lane of the input/output section comprises an amplifier 172, a first demultiplexer 174, a register 176 and a second demultiplexer 178 connected between the contact pad 138 and the second FIFO memory 134 or the third FIFO memory 156, respectively for the receiving circuits 128, 138. The amplifier 172 is also called a receiver. The first demultiplexer 174 increases the number of parallel lines from one to eight and reduces the bit rate by a factor of eight. The second demultiplexer 178 increases the number of parallel lines from eight to 16 and reduces the bit rate on each single line by a factor of two.

The memory device displayed in FIG. 2 differs from the memory device described above with reference to FIG. 1 in the way of processing an external clock from the memory controller or another external circuit. A clock synthesizing unit (CSU) 182 is connected to a first contact pad 184 for receiving a clock signal and to a second contact pad 186 for transmitting a clock signal. The clock synthesizing unit 182 may be a phase lock loop (PLL) or a delay lock loop (DLL) with inherent clock multiplication.

The clock synthesizing unit 182 produces a clock normal provided to the lanes 122, 124, 126, 128, 152, 154 of the input/output section 50, 60 and to a first clock divider 188. The clock normal provided by the clock synthesizing unit 182 may be particularly provided to the amplifiers 168, 172 and/or to the second multiplexer 166 and the first demultiplexer 174 of each lane. Alternatively, each amplifier 172 provides an inherent symbol clock synchronization.

The first clock divider 188 divides the clock normal provided by the clock synthesizing unit 182 by a factor of eight. The divided clock normal is provided to the lanes of the input/output section 50, 60 and to a second clock divider 190. The divided clock normal may be provided to the registers 164, 176 and, the divided clock normal may be further provided to one or more of the first multiplexer 162, the second multiplexer 166, the first demultiplexer 174 and the second demultiplexer 178.

The second clock divider 190 divides the divided clock normal by a factor of two. The twice-divided clock normal is provided to the FIFO memories 132, 134, 156, to the tenth interface 54 of the first part 50 of the input/output section and to the twelfth interface 64 of the second part 60. The tenth and twelfth interfaces 54, 64 may provide the twice-divided clock normal to the fourth and sixth interfaces 32, 36 of the control logic 30 via the clock lines 108, 112, respectively. The array of memory cells 20, the control logic 30, their interfaces 22, 24, 26, 32, 34, 36, 38, 40 and their operation are like those of the first embodiment.

For an application of the memory device 10 in a computer, it is connected to the memory controller of the computer via the contact pads 138, 184,186. The clock synthesizing unit receives an external clock from the memory controller via the contact pad 184. This clock may be, e.g., 3.2 GHz, which is divided by the first and second clock dividers 188, 190 to an internal clock normal of 200 MHz. The first part 50 of the input/output section receives data or data signals to be stored in memory cells of the array 20 via the contact pads 138. These data signals are amplified by the amplifier 168 of the receiving circuits 128 of each lane.

The transfer of the data signals from the memory controller to the memory device 10 is controlled by the external clock. During each clock cycle, eight bits are received in parallel via eight contact pads 138. In each lane, the first demultiplexer 174, the register 176 and the second demultiplexer 178 convert the one-bit parallel 3.2 GHz data stream to a sixteen-bit parallel 200 MHz data stream. All eight lanes together convert the eight-bit parallel 3.2 GHz data stream to a 128-bit parallel 200 MHz data stream which is provided to the second FIFO memory 134. Via the 128 parallel lines 148, the tenth interface 54, the 128 parallel lines 82 and the fourth interface 32, the data are forwarded to the control logic 30.

Simultaneous to or with any other predefined temporal relationship to the receipt of the data by the first part 50 of the input/output section, the second part 60 of the input/output section receives command and address signals via four contact pads 138. The command signals indicate that the data received by the first part 50 of the input/output section are to be stored in memory cells of the array 20. The address signals identify the memory cells or groups of memory cells of the array 20 in which the data is to be stored. Alternatively, the address signals identify the first and last addresses of a range of addresses or region for the first address and the size of the range or region in the array 20 in which subsequently transferred data is to be stored.

The transfer of the command and address signals from the memory controller to the memory device 10 is controlled by the external clock received via the contact pad 184. The command and address signals are amplified by the amplifier 172 of each lane. In each lane 152, 154 the common or address signal is converted from one-bit parallel 3.2 GHz to sixteen-bit parallel 200 MHz by the first demultiplexer 174, the register 176 and the second demultiplexer 178. The four lanes 152, 154 convert the four-bit parallel 3.2 GHz command or address signal stream to a 64-bit parallel 200 MHz command or address signal stream which is provided to the third FIFO memory 156. Via the 64 parallel lines 160, the twelfth interface 64, the 64 parallel lines 84 and the sixth interface 36, the commands or addresses are forwarded to the control logic 30.

The control logic 30 controls the writing of the data to the memory cells identified by the address or addresses according to the command. In this embodiment, no clock signal is provided to the array 20. Rather, the array 20 is operated asynchronously. Many types of memory cells and many types of arrays of memory cells need to be operated asynchronously due to their physical nature. However, if the array 20 of memory cells can be operated synchronously, the twice-divided clock provided by the clock synthesizing unit 182 and the clock dividers 188, 190 or any clock derived from this twice-divided clock may be provided to the array 20, as well. In the case of an asynchronous array 20, the first interface 22 of the array 20 may provide a local clock to the fifth interface 34 of the control logic 30 via the clock line 110. This local clock improves communication between the control logic 30 and the array 20 of memory cells.

When data are to be read from memory cells of the array 20, a read command and an address identifying the memory cell or the memory cells are transferred from the memory controller to the second part 60 of the input/output section via the corresponding four contact pads 138. With regard to the processing of signals by the input/output section 50, 60, the reading process differs from the writing process described above in two aspects. Firstly, the temporal relationship between the command and address signals and the data signals is necessarily such that the data signals are processed after the command and address signals. Secondly, the data signals are processed in the other direction.

The data read from the memory cells of the array 20 by the control logic 30 via the first interface 22, the lines 72 and the fifth interface 34 are transferred to the first part 50 of the input/output section via the fourth interface 32 of the control logic 30, the 128 parallel lines 82 and the tenth interface 54. Then, the data are transferred to the first FIFO memory 132 via the 128 parallel lines 146. The data are transferred from the first FIFO memory 132 to the eight parallel lanes 122, 124 via eight groups of 16 lines 142 each. In the transmitting circuit 126 of each lane, 16-bit parallel 200 MHz data signals are converted to one-bit parallel 3.2 GHz data signals via the first multiplexer 162, the register 164 and the second multiplexer 166. In this way, the 128-bit parallel 200 MHz data stream is converted to eight-bit parallel 3.2 GHz by the eight parallel lanes. Finally this converted lowly parallel, high bit rate data stream is amplified by the amplifiers 168 in the transmitting circuits 126 of each lane and transferred to the memory controller via the contact pads 138.

In the lanes, the multiplexers 162, 166 and demultiplexers 174, 178 are controlled by the clock normal provided by the clock synthesizing unit 182, by the divided clock normal divided by the first clock divider 188, and by the twice divided clock normal divided by the second clock divider 190. This controlling of the conversion of the command, address and data streams makes these conversions highly reliable even with a conversion factor as high as sixteen or even higher.

In the embodiments described above with reference to the FIGS. 1 and 2, the array 20 of memory cells, the control logic 30 and the input/output section 50, 60 comprise interfaces 22, 24, 26, 32, 34, 36, 38, 40, 54, 64. Each of these interfaces may be merely the place where lines cross the border of the respective component or section. Alternatively, an interface is the place where an outgoing signal from a component or section is manipulated for the last time, or where an incoming is manipulated for the first time. Each interface may comprise amplifiers, or drivers, for outgoing signals or amplifiers, or receivers for incoming signals. Further, each interface may comprise latches or buffers or memories for short time storage of the incoming or outgoing signals. Thus, the FIFO memories 132, 134, 156 of the second embodiment may be parts of the interfaces 54, 64, respectively, of the input/output section, as well.

Figure 3:
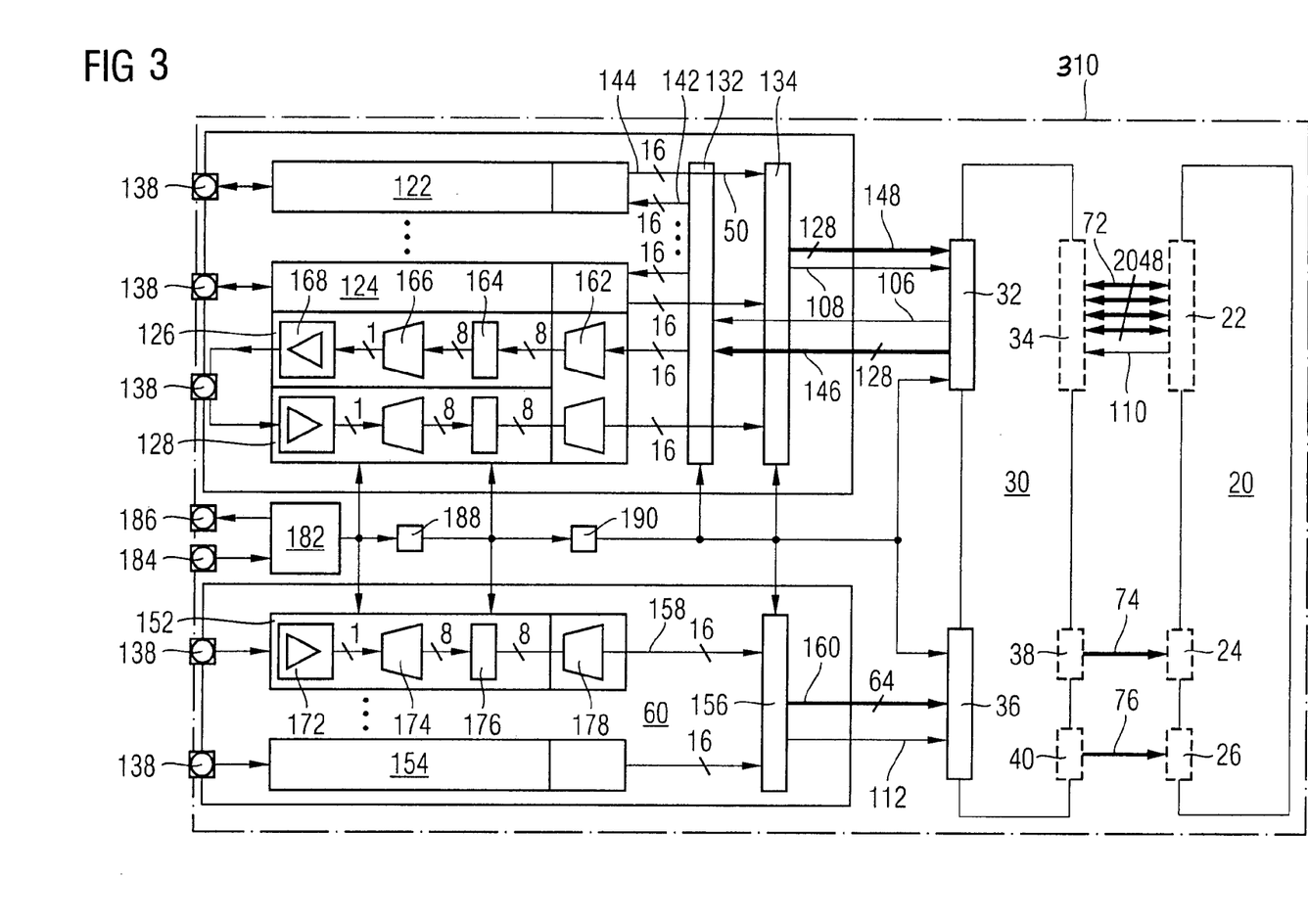
FIG. 3 is a schematic circuit diagram of a memory device according to a third embodiment of the present invention.

FIG. 3 is a schematic circuit diagram of a memory device 310 according to a third embodiment of the present invention. This memory device 310 comprises an array 20 of memory cells, a control logic 30 and an input/output section 50, 60 which are by and large quite similar to those of the second embodiment.

The third embodiment differs from the second embodiment in that the first and second FIFO memories 132, 134 of the first part 50 of the input/output section are directly connected to the fourth interface of the control logic 30 via 128 lines 146 and 128 lines 148, respectively. Whereas the tenth interface 54 of the first part 50 of the input/output section of the second embodiment needs to comprise means for converting two-way signal traffic on the 128 lines 82 to the one-way traffic on the 128 lines 146 and the 128 lines 148 and vice versa, these means are not necessary in the third embodiment. In FIG. 3, the control logic 30 and the first part 50 of the input/output section are not connected by 128 lines 82 provided for the transfer of signals in both directions for the embodiment shown in FIG. 2. Rather, the control logic 30 and the first part 50 of the input/output section are connected by 128 lines 148 transferring signals from the first part 50 to the control logic 30 and by 128 lines 156 transferring signals from the control logic 30 to the first part 50.

Further, the memory device 10 according to the third embodiment differs from the second embodiment in that the third FIFO memory 156 of the second part 60 of the input/output section is directly connected to the sixth interface 36 of the control logic 30 via 64 lines 160. Whereas the twelfth interface 64 of the second part 60 of the input/output section in the second embodiment may comprise amplifiers or drivers, for example, such are not provided in the third embodiment.

Further, the memory device 10 according to the third embodiment differs from the second embodiment in that the twice divided clock normal provided by the second clock divider 190 is directly provided to the fourth interface 32 and the sixth interface 36 of the control logic 30. This means that the control logic 30 is directly synchronized to the input/output section by use of the same twice divided clock normal. In addition, the fourth interface 32 of the control logic 30 receives a clock signal from the second FIFO memory 134 via the clock line 108 for controlling the transfer of signals or data from the second FIFO memory 134 to the fourth interface 32 of the control logic 30. Further, the first FIFO memory 132 receives a clock signal from the fourth interface 32 of the control logic 30 via the clock line 106 for controlling the transfer of signals or data from the control logic 30 to the first part 50 of the input/output section. Further, the sixth interface 36 of the control logic 30 receives a clock signal from the third FIFO memory 156 for controlling the transfer of signals or commands and addresses from the second part 60 of the input/output section to the sixth interface 36 of the control logic 30.

Alternatively no clock lines 106, 108, 112 are provided between the FIFO memories 132, 134, 156 of the input/output section 50, 60 and the fourth and sixth interfaces 32, 36 of the control logic 30. These clock lines can be omitted since both the FIFO memories 132, 134, 156 and the fourth and sixth interfaces 32, 36 of the control logic 30 are directly provided with the same twice divided clock normal from the second clock divider 190. This twice divided clock normal synchronizes and controls any transfer of signals, or data, commands and addresses, between the input/output section 50, 60 and the control logic 30.

As already mentioned in the description of the first embodiment, the number of the lines 72 connecting the first interface 22 of the array 20 of memory cells and the fifth interface 34 of the control logic 30 may be any number. In FIG. 3 the number of parallel lines 72 is given as 2048 as a typical example. However, any arbitrary number of parallel lines 72 may be provided.

In the memory devices according to the first three embodiments described above with reference to FIGS. 1 to 3, the first part 50 of the input/output section receives data from the memory controller and transmits data to the memory controller, or other external circuit via the same lines 86. Thus, the ninth interface 52 of the first part 50 of the input/output section of the memory device 10 according to the first embodiment is configured to be able to transmit and receive signals and to switch between transmission and reception and vice versa. In the second and third embodiments, the requirement that signals can be both received and transmitted via the contact pads 138 is fulfilled by the provision of both the transmitting circuit 126 and the receiving circuit 128 in each lane of the first part 50 of the input/output section.

Figure 4:
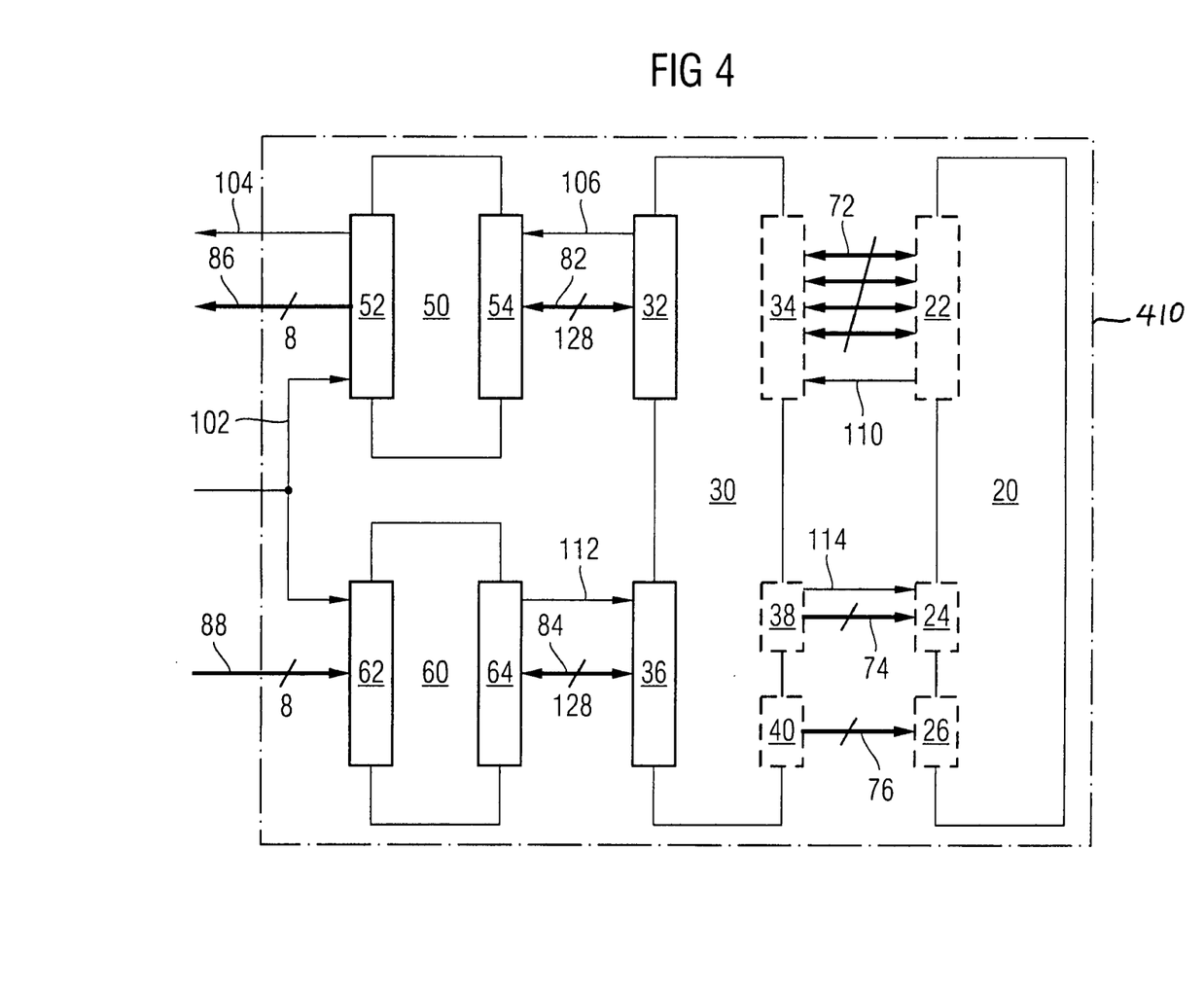
FIG. 4 is a schematic circuit diagram of a memory device according to a fourth embodiment of the present invention.

FIG. 4 is a schematic circuit diagram of a memory device 410 according to a fourth embodiment of the present invention. Similar to the first to the third embodiments, the memory device 410 according to the fourth embodiment comprises an array 20 of memory cells, a control logic 30 and an input/output section 50, 60. These components and sections comprise interfaces 22, 24, 26, 32, 34, 36, 38, 40, 52, 54, 62, 64 similar to the corresponding interfaces provided in the first embodiment.

In the first embodiment, the second part 60 of the input/output section receives command and address signals from the memory controller and forwards these command and address signals to the control logic 30. The first part 50 of the input/output section both receives data signals from the memory controller which are then forwarded to the control logic 30 and transmits data signals to the memory controller which it received from the control logic 30.

In contrast to the first embodiment, in the fourth embodiment, each part 50, 60 of the input/output section is provided for one-way communication only. The second part 60 of the input/output section receives command, address and data signals from the memory controller via its eleventh interface 62 and transmits these signals (after a conversion) to the control logic 30 via its twelfth interface 64, and the first part 50 of the input/output section solely transmits signals to the memory controller via its tenth interface 52 which it received from the control logic via its eleventh interface 54. In other words, the input/output section comprises a separate transmitter (first part 50) for transmitting data and control signals to the external memory controller, and a separate receiver (second part 60) for receiving data, address and control signals from the external memory controller.

For this purpose, eight parallel lines 88 connecting the eleventh interface 62 of the second part 60 of the input/ output section with the memory controller and 128 parallel lines 84 connecting the twelfth interface 64 of the second part 60 with the sixth interface 36 of the control logic 30 are provided. Thereby, the total capacity or bandwidth for a transfer of command, address and data signals from the memory controller to the memory device 410 equals the capacity, or bandwidth, of the transfer of data and control signals from the memory device 410 to the memory controller. The functionality and structure of the control logic 30 of the fourth embodiment are different from those according to the first to the third embodiment as the control logic 30 now receives both command, address and data signals via its sixth interface 36 and merely transmits data signals via its fourth interface 32.

This one-way communication between the fourth interface 32 of the control logic 30 and the tenth interface 54 of the first part 50 of the input/output section and between the ninth interface 52 of the first part 50 of the input/output section and the memory controller simplifies both the structure of the first part 50 and its operation. The structure of the first part 50 of the input/output section is simplified because it needs to convert signals only from 128-bit parallel low bit rate to 8-bit parallel high bit rate, but not the other way round. The operation of the first part 50 of the input/output section is simplified in that it needs not switch between two directions of communication, i.e., between a mode of transmitting signals to the memory controller and a mode of receiving signals from the memory controller. Particularly, the simplification of the operation of the input/output section 50, 60 effectuates the overall speed of the memory device 10 and the amount of data which can be written to and read from the memory device in a given period of time.

In the fourth embodiment, the transfer of command, address and data signals from the memory controller or any other external circuit to the second part 60 of the input/output section, from there to the control logic 30 and from the control logic 30 to the array 20 of memory cells, is controlled by clock signals which are transmitted parallel to the command, address and data signals via clock lines 102, 112, 114. The clock signal transferred via the clock line 112 from the second part 60 of the input/output section to the control logic 30 is the same as or is derived by clock division from the clock signal transferred from the memory controller to the input/output section 50, 60 via the clock line 102. The clock transferred from the control logic 30 to the array 20 of memory cells via the clock line 114 is the same as or derived by clock division from the clock transferred from the input/output section 50, 60 to the control logic 30 via the clock line 112. The whole control logic 30 is controlled by the clock it receives via the clock line 112 from the input/output section 50, 60. The whole array 20 of memory cells is controlled by the clock it receives from the control logic 30 via the clock line 114.

However, depending on the physical nature of the array 20 of memory cells or of the refreshing mechanism or the sense amplifiers or any other components of the array 20, it may be impossible or inexpedient to control the array 20 by this clock. In such case, the array 20 has its own timing, and the transfer of data from the array 20 to the control logic 30 is controlled by a clock generated by the array 20 and transferred from the array 20 to the control logic 30 via the clock line 110. Further, in such case, it may be advantageous to control the transfer of data from the control logic to the first part 50 of the input/output section by the clock generated by the array 20 or by a clock derived from the latter and transferred from the control logic 30 to the input/output section 50, 60 via the clock line 106. It may be further advantageous to control also the transfer of data from the first part 50 of the input/output section to the memory controller by a clock synchronous to or directly or indirectly derived from the clock generated by the array 20 and transferred to the memory controller via the clock line 104.

Figure 5:
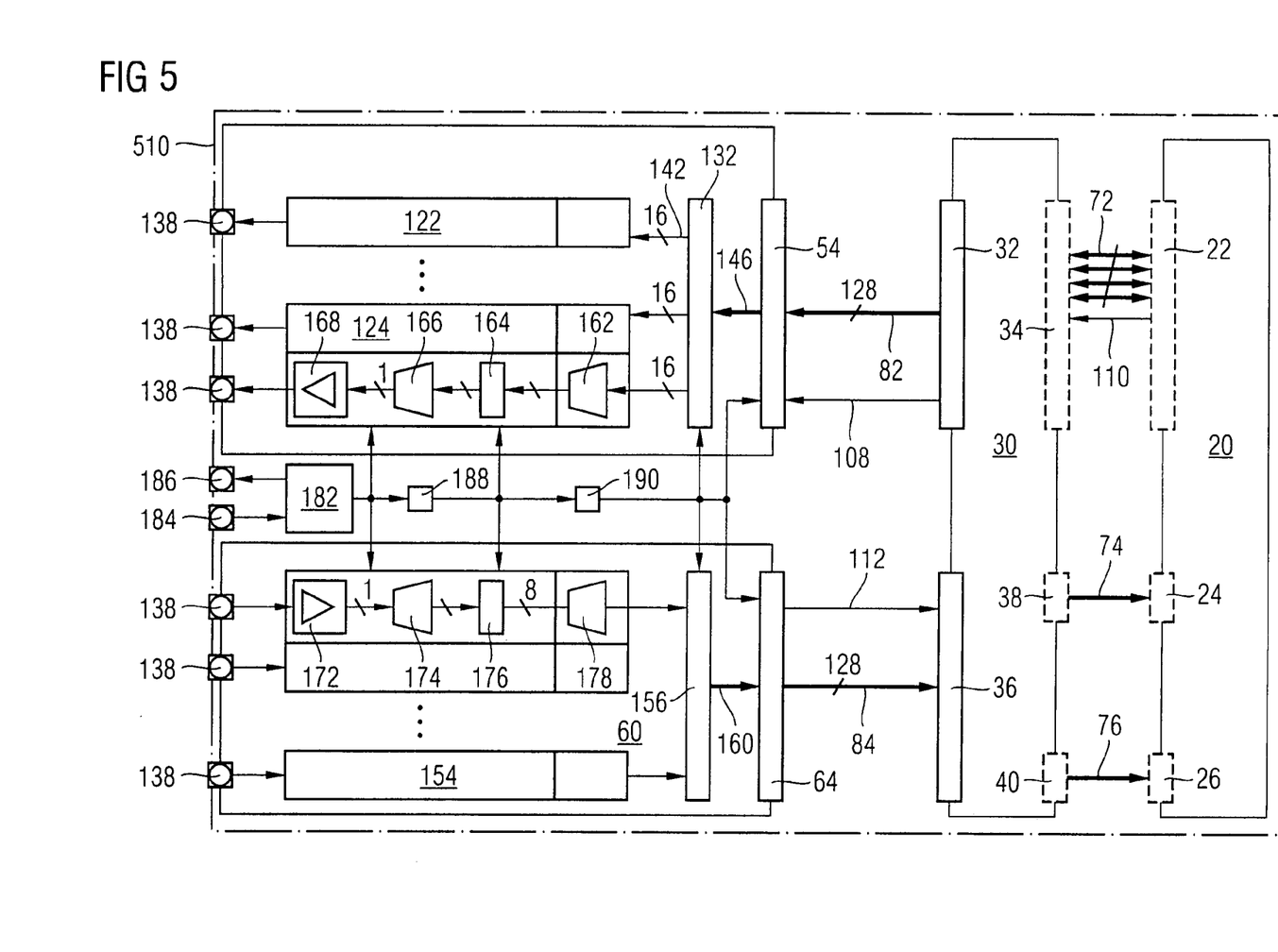
FIG. 5 is a schematic circuit diagram of a memory device according to a fifth embodiment of the present invention.

FIG. 5 is a schematic circuit diagram of a memory device 510 according to a fifth embodiment of the present invention. Like the first to fourth embodiments, the fifth embodiment comprises an array 20 of memory cells, a control logic 30 and an input/output section 50, 60 connected to each other via interfaces 22, 24, 26, 32, 34, 36, 38, 40, 54, 64 and lines 72, 74, 76, 82, 84. Similar to the fourth embodiment, the first part 50 of the input/output section is provided for transferring signals in one direction from the control logic 30 to an external memory controller or another external circuit only, and the second part 60 of the input/output section is provided for transferring signals in one direction from the external memory controller or other circuit to the control logic only.

Unlike the memory device 410 according to the fourth embodiment, no clock line 114 is provided between the second interface 24 of the array 20 and the seventh interface 38 of the control logic 30. This means that the transfer of address signals from the control logic 30 to the array 20 of memory cells is not synchronized, or controlled by any clock. However, an additional clock line may be provided to control the transfer of address signals and/or parts of the array 20 by a clock.

FIG. 5 displays details of the input/output section 50, 60. From a comparison of FIG. 5 with FIG. 2, it is shown that the fifth embodiment differs from the second embodiment in the number of lanes in the second part 60 of the input/output section and in that each lane of the first part 50 of the input/output section comprises only a transmitting circuit (first multiplexer 162, register 164, second multiplexer 166, amplifier 168) but no receiving circuit. In the fifth embodiment, the number of lanes in the second part 60 of the input/output section is eight and equals the number of lanes of the first part 50 of the input/output section. Thus, the input/output section 50, 60 comprises a greater number of lanes than in the second embodiment, but the structure of each lane of the first part 50 is simpler in the embodiment shown in FIG. 5. All in all, the number of elements (multiplexers 162, 166, demultiplexers 174, 178, registers 164, 176, amplifiers 168, 172) is reduced. Further, the operation of the input/output section is simplified since it is not necessary to switch between two directions of signal transfer.

From a comparison of FIG. 5 with FIG. 2, it is shown that in the fifth embodiment, the processing of the external clock and the conditioning, or preparation, of an internal clock normal by a clock synthesizing unit 182 and clock dividers 188, 190 is similar to the second embodiment.

In the embodiments described above with reference to the FIGS. 1 to 5, specific numbers of parallel lines 72, 74, 82, 84, 86, 88 connecting the interfaces and specific numbers of lanes in the first and second parts 50, 60 of the input/output section were given. Further, the factor by which the degree of parallelism and the bit rate on each single line are changed in the lanes of the input/output section, the number of stages or multiplexers 162, 166 and demultiplexers 174, 178 as well as the number of clock dividers 188, 190 were given specific numeric values. It is contemplated that the present invention may be implemented with any other numbers of parallel lines 72, 74, 82, 84, 86, 88 with any other numbers of lanes in the parts 50, 60 of the input/output section, with any other conversion factors, with any other numbers of multiplexers 162, 166 and demultiplexers 174, 178, with any other number of clock dividers 188, 190 and with arbitrary external and corresponding internal clock frequencies, as well. Further, from the above description of the embodiments, it is clear that the memory device according to embodiments of the invention may comprise several arrays of memory cells and that the external memory controller or other circuit exchanging data with the memory device may be provided on a separate chip, but that the memory device may be advantageously integrated with a memory controller, a processor or any other circuit on one single chip as well.

The clock lines 102, 104, 106, 108, 110, 112, 114 provide for a synchronous and thereby more secure transfer of signals by transmitting the clock signal from the sending interface to the receiving interface. These clock signals may be further utilized for synchronizing the input/output section 50, 60 and/or the control logic 30 and/or the array 20 of memory cells or at least parts of them. One global internal clock may be provided to the input/output section 50, 60 and to the control logic 30, and also to the array 20 of memory cells. For this purpose, the architecture, or topology, of clock lines may be different from the embodiments described above with reference to the Figures.

Further, a synchronizing facility synchronizing the transfer of signals between interfaces or components and sections of the memory device, a synchronizing facility synchronizing the operation of components and sections of the memory device, or a synchronizing facility synchronizing the whole memory device may be realized with a smaller number of clock lines or even without clock lines. The clock controlling the transmission of a signal is implicitly present in the signal received at the other end of the line. Therefore, the synchronizing facility may comprise a circuit at each receiving interface which derives the transmission clock from the received signal, for example, by means of a tunable oscillator with high Q-factor. As a further alternative, the clock may be provided as a modulated light signal from a light source illuminating the whole circuit, the clock being received by a phototransistor or any other light sensitive device at each place in the circuit where the clock is utilized.

Figure 6:
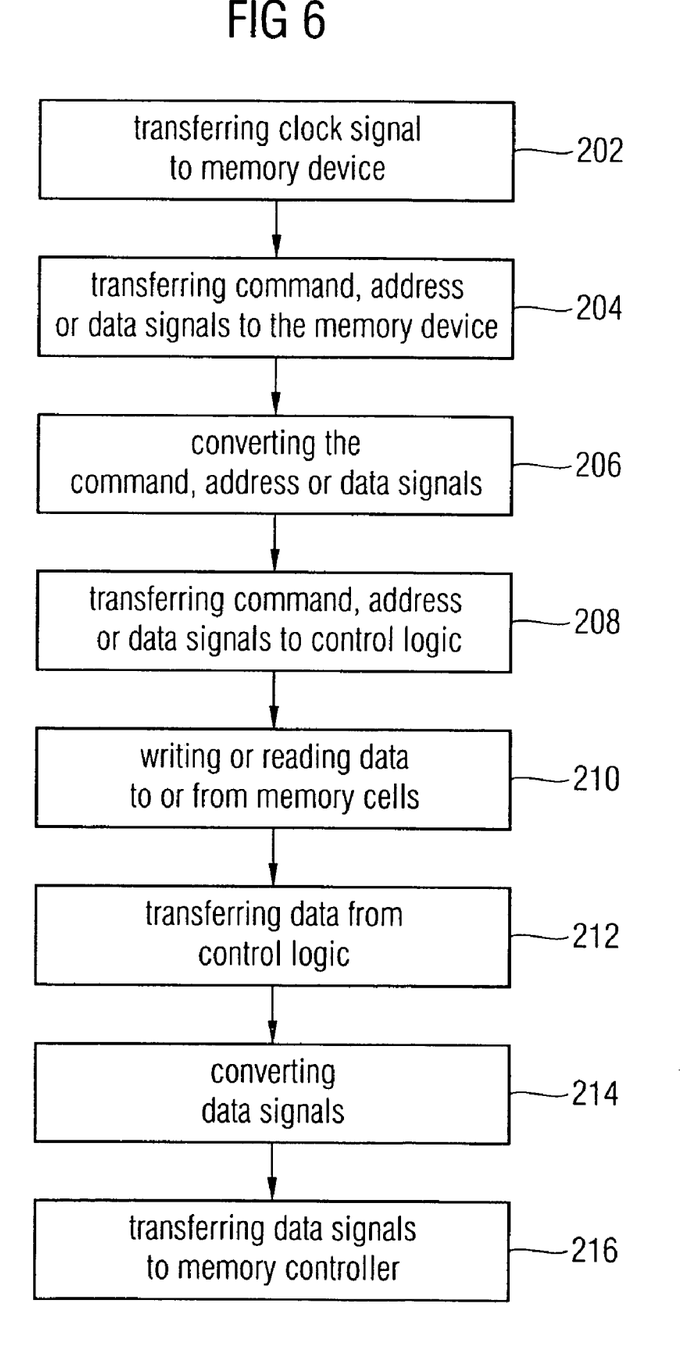
FIG. 6 is a schematic flow chart of a method according to a sixth embodiment of the present invention.

FIG. 6 is a schematic flowchart of a method according to a sixth embodiment of the present invention. In a first step 202, a clock signal is transferred to a memory device from a memory controller or any other circuit external to the memory device. In a second step 204, command, address or data signals are transferred from the memory controller to the memory device, these signals being controlled by or synchronous to the clock signal.

In a third step 206, the command, address or data signals are converted from lowly parallel high bit rate to highly parallel low bit rate. This conversion is again controlled by the first clock signal and/or by a second clock signal derived from the first clock signal by clock division. In a fourth step 208, the converted command, address or data signals are transferred to a control logic of the memory device. This transfer may be controlled by a second clock signal.

In a fifth step 210, data are written to or read from memory cells controlled by the control logic according to the command, address or data signals received by the control logic.

If in the fifth step 210, data are read from the memory cells, these are transferred from the control logic to an input/output section of the memory device in a sixth step 212. In a seventh step 214, the data signals are converted from highly parallel low bit rate to lowly parallel high bit rate in the input/output section of the memory device. The transfer of data in the sixth step 212 as well as the conversion of the data in the seventh step 214 each may be controlled by the second clock signal.

In an eighth step 216, the converted data are transferred to the memory controller, this transfer again being controlled by the first clock signal.

While the foregoing is directed to embodiments of the present invention, other and further embodiments of the invention may be devised without departing from the basic scope thereof, and the scope thereof is determined by the claims that follow.

What is claimed is:

1. A memory device, comprising:
   an array of memory cells;
   a control logic for writing data to and reading data from the array of memory cells, the control logic comprising a first interface;
   an input/output section for exchanging data, address and control signals with a circuit external to the memory device, the input/output section comprising a second interface for sending signals to and receiving signals from the first interface of the control logic; and
   a synchronizing facility connected to the first interface of the control logic and to the second interface of the input/output section for synchronizing a clock signal of the first interface of the control logic and a clock signal of the second interface of the input/output section, wherein
   the control logic comprises a third interface,
   the array of memory cells comprises a fourth interface for sending signals to and receiving signals from the third interface of the control logic, and
   the synchronizing facility is connected to the third interface of the control logic and to the fourth interface of the of the array of memory cells for synchronizing a clock signal of the third interface of the control logic and a clock signal of the fourth interface of the array of memory cells.

2. The memory device of claim 1, wherein the synchronizing facility is connected to the second interface of the input/output section, to the first and third interfaces of the control logic and to the fourth interface of the of the array of memory cells for synchronizing respective clock signals of the first and third interfaces of the control logic, the second interface of the input output section and the fourth interface of the array of memory cells.

3. The memory device of claim 1, wherein the synchronizing facility is connected to the second interface of the input/output section, to the first and third interfaces of the control logic and to the fourth interface of the array of memory cells for providing the same clock signal to all the first to fourth interfaces.

4. The memory device of claim 1, further comprising:
   a clock receiver for receiving a clock signal from an external memory controller, wherein the control logic and the input/output section are synchronized to the clock of the external memory controller.

5. The memory device of claim 4, wherein the clock receiver comprises a clock synthesizing unit.

6. The memory device of claim 4, wherein the clock receiver comprises one of a phase lock loop circuit and a delay lock loop circuit.

7. The memory device of claim 4, wherein the clock receiver comprises a clock divider for dividing the clock of the external memory controller.

8. A memory device, comprising:
an array of memory cells;
a control logic for writing data to and reading data from the array of memory cells, the control logic comprising a first interface;
an input/output section for exchanging data, address and control signals with a circuit external to the memory device, the input/output section comprising a second interface for sending signals to and receiving signals from the first interface of the control logic; and
a synchronizing facility connected to the first interface of the control logic and to the second interface of the input/output section for synchronizing a clock signal of the first interface of the control logic and a clock signal of the second interface of the input/output section,
wherein
the input/output section exchanges data, address and control signals with the circuit external to the memory device via a first number of parallel first lines at a first bit rate at each line, and
the second interface sends signals to and receives signals from the first interface of the control logic via a second number of parallel second lines at a second bit rate at each second line, the second number being greater than the first number and the second bit rate being less than the first bit rate.

9. The memory device of claim 8, wherein the clock signals of the input/output section and the control logic are synchronised by a derived clock signal which is derived from an external clock signal by clock division, wherein the derived clock is the external clock divided by a reduction factor reflecting a ratio of the first bit rate to the second bit rate.

10. A memory device, comprising:
an array of memory cells;
a control logic for writing data to and reading data from the array of memory cells, the control logic comprising a first interface;
an input/output section for exchanging data, address and control signals with a circuit external to the memory device, the input/output section comprising a second interface for sending signals to and receiving signals from the first interface of the control logic; and
a synchronizing facility connected to the first interface of the control logic and to the second interface of the input/output section for synchronizing a clock signal of the first interface of the control logic and a clock signal of the second interface of the input/output section;
wherein the input/output section comprises:
a receiver for receiving data, address and control signals from an external memory controller; and
a transmitter for transmitting data and control signals to the external memory controller;
wherein the second interface comprises a first part connected to the receiver for sending signals to the first interface of the control logic and a second part connected to the transmitter for receiving signals from the control logic, and
wherein the synchronizing facility is connected to the first interface of the control logic, to the first part of the second interface and to the second part of the second interface for synchronizing clock signals of the first interface and of the first and second parts of the second interface.

11. A memory device, comprising:
an array of memory cells;
a control logic for writing data to and reading data from the array of memory cells;
an input/output section for receiving and transmitting data, address and control signals, wherein the input/output section comprises:
a receiver for receiving data, address and control signals from an external memory controller; and
a transmitter for transmitting data and control signals to the external memory controller;
a clock line connected to the control logic and to the input/output section for transmitting a clock signal between the control logic and the input/output section, wherein the clock line is connected to both the receiver and the transmitter for transmitting the clock signal between the control logic and both the receiver and the transmitter; and
an output clock line for outputting the clock signal from the input/output section to an external circuit.

12. The memory device of claim 11, wherein
the control logic comprises a first interface,
the input/output section comprises a second interface for sending signals to and receiving signals from the first interface of the control logic, and
the clock line is connected to the first interface of the control logic and to the second interface of the input/output section.

13. The memory device of claim 11, wherein the clock line is connected to the array of memory cells for synchronizing a clock of the control logic, a clock of the input/output section and a clock provided for writing data to or reading data from the array of memory cells.

14. The memory device of claim 11, further comprising:
a clock receiver for receiving a clock signal from an external memory controller, wherein the control logic and the input/output section are synchronized to the clock of the external memory controller.

15. The memory device of claim 14, wherein the clock receiver comprises one of:
a clock synthesizing unit;
a phase lock loop circuit;
a delay lock loop circuit; and
a clock divider for dividing the clock of the external memory controller.

16. A memory device, comprising:
an array of memory cells;
a control logic for writing data to and reading data from the array of memory cells;
an input/output section for receiving and transmitting data, address and control signals;
a synchronizing facility for synchronizing a clock of the control logic, a clock of the input/output section and a clock provided for writing data to or reading data from the array of memory cells; and
an output clock line for outputting the clock signal from the input/output section to an external circuit.

17. The memory device of claim 16, further comprising:
a clock receiver for receiving a clock signal from an external memory controller, wherein the control logic and the input/output section are synchronized to the clock of the external memory controller.

18. The memory device of claim 17, wherein the clock receiver comprises one of:
a clock synthesizing unit;
a phase lock loop circuit;
a delay lock loop circuit; and a clock divider for dividing the clock of the external memory controller.

19. A method for operating a memory device, comprising:

transferring an external clock signal to the memory device from a memory controller;

transferring command, address and data signals, synchronously to the external clock signal, from the memory controller to the memory device;

converting the command, address or data signals from a first bit rate to a second bit rate, wherein the first bit rate is higher than the second bit rate;

transferring the converted command, address and data signals to a control logic of the memory device, utilizing a derived clock signal derived from the external clock signal, wherein the derived clock is the external clock divided by a reduction factor reflecting a ratio of the first bit rate to the second bit rate; and performing one of writing data to and reading data from memory cells controlled by the control logic according to the command, address or data signals received by the control logic.

20. The method of claim 19, further comprising:

when data are read from the memory cells, transferring data signals from the control logic to an input/output section of the memory device utilizing a clock signal based on a clock signal of the memory cells;

converting the data signals are converted from the second bit rate to the first bit rate in the input/output section of the memory device; and transferring the converted data to the memory controller.

* * * * *